United States Patent [19]
Ogata et al.

[11] Patent Number: 5,602,420
[45] Date of Patent: Feb. 11, 1997

[54] STACKED HIGH MOUNTING DENSITY SEMICONDUCTOR DEVICES

[75] Inventors: Masatsugu Ogata, Hitachi; Teruo Kitamura, Katsuta; Shuji Eguchi, Ibaraki-ken; Kenji Akeyama, Gunma-ken, all of Japan

[73] Assignee: Hitachi, Ltd., Tokyo, Japan

[21] Appl. No.: 429,463

[22] Filed: Apr. 27, 1995

Related U.S. Application Data

[63] Continuation of Ser. No. 117,933, Sep. 7, 1993, abandoned.

[30] Foreign Application Priority Data

Sep. 7, 1992 [JP] Japan .................................. 4-238015

[51] Int. Cl.$^6$ .................. H01L 23/02; H01L 23/495; H01L 23/48; H01L 23/52
[52] U.S. Cl. .................. 257/686; 257/666; 257/692; 257/673
[58] Field of Search .................. 257/686, 777, 257/666.4, 692, 696, 673, 666

[56] References Cited

U.S. PATENT DOCUMENTS

| | | | |
|---|---|---|---|
| 4,541,003 | 9/1985 | Otsuka et al. | 257/777 |
| 4,956,694 | 9/1990 | Eide | 257/686 |
| 4,996,587 | 2/1991 | Hinrichsmeyer et al. | 257/686 |
| 5,138,438 | 8/1992 | Masayuki et al. | 257/686 |
| 5,198,888 | 3/1993 | Sugano et al. | 257/686 |

FOREIGN PATENT DOCUMENTS

| | | | |
|---|---|---|---|
| 52-075981 | 6/1977 | Japan | 257/777 |
| 58-159361 | 9/1983 | Japan | 257/777 |
| 03041758 | 2/1991 | Japan | 257/666.4 |
| 04029363 | 2/1992 | Japan | 257/666.4 |
| 04291753 | 10/1992 | Japan | 257/777 |
| 05315540 | 11/1993 | Japan | 257/777 |

Primary Examiner—Mahshid Saadat
Assistant Examiner—T. M. Arroyo
Attorney, Agent, or Firm—Antonelli, Terry, Stout & Kraus, LLP

[57] ABSTRACT

A semiconductor device is provided with a stack of a plurality of semiconductor elements each having a bump deposited on each of surface electrodes, and a plurality of leads disposed closely adjacent to the stacked semiconductor elements, the leads being bonded to the bumps respectively thereby structurally integrally assembling the plural semiconductor elements.

30 Claims, 4 Drawing Sheets

STACKED HIGH MOUNTING DENSITY SEMICONDUCTOR DEVICES

This application is a continuation application of application Ser. No. 08/117,933, filed on Sep. 7, 1993, abandoned.

BACKGROUND OF THE INVENTION

The present invention relates generally to packaging technology for mounting a stack of a plurality of semiconductor elements to form a semiconductor device, and more particularly to such a semiconductor device comprising semiconductor elements that can be mounted with high mounting efficiency.

With the recent requirements for reducing the size and weight of and improving the operating performance of electronic and electrical apparatuses, an improvement in the mounting density is now increasingly strongly demanded for semiconductor parts. In an effort to comply with such needs, researches and studies for reducing the size, weight and thickness of a package have been positively promoted up to now. Especially, a variety of improvements have hitherto been made on the structure of the semiconductor package too, so that large chips can be accommodated in a package that is as small as possible. A package structure for semiconductor parts is commonly widely known. In this known package structure, a semiconductor element is fixed by the use of an electrically conductive adhesive to a die-pad part of a lead frame, and, after wire bonding inner leads of the lead frame to the electrodes on the surface of the semiconductor element, the peripheral part of the semiconductor element is sealed by the use of an encapsulant.

The needs for packaging semiconductor parts with a high mounting density becomes recently increasingly stronger, and a package of the LOC (lead on chip) type is known as a new package structure. In this known package, a semiconductor element is directly fixed to inner leads of a lead frame having no die-pad part, and, after wire bonding the inner leads of the lead frame to the electrodes on the surface of the semiconductor element, the peripheral part of the semiconductor element is sealed by the use of an encapsulant. (Such a package is described in a magazine entitled "Nikkei Microdevice", February issue, 1991, pages 89–97.)

Also, a method called TAB (tape automated bonding) or a method called TSOP (thin small outline package) in which a plurality of thin packages are mounted in a stacked relation is known. (Such a method is described in "Nikkei Microdevice", April issue, 1992, page 51.) In addition, a method of sealing a plurality of chips in a single package by an encapsulant is also known. (Such a method is described in "Nikkei Microdevice", April issue, 1991, page 80.)

Especially, a method of connecting a plurality of semiconductor elements by the use of filmy leads and pins (as disclosed in JP-A-61-32560) and a method of connecting a plurality of semiconductor elements by the use of a wiring board disposed along one of the side surfaces of the elements (as disclosed in JP-A-62-293749) are known as a technique for stacking a plurality of semiconductor elements.

By various modes of contrivance applied to the package structure as described above, the efficiency of mounting a plurality of semiconductor elements in a package can be greatly improved as compared to the case of the use of the prior art package. However, in spite of such an improvement in the mounting efficiency for the package itself, the mounting efficiency for the semiconductor device as a whole has not necessarily been still satisfactory. This is because, for example, a frame is inevitably required for fixing stacked packages or for establishing electrical connections with other elements. Also, because all of outer leads extending from the individual packages are joined as required to be combined or reshaped into a single outer lead to be connected to a printed wiring board by soldering, the area required for mounting the chips becomes considerably larger than the projected area of the chips.

Further, because the packaged semiconductor elements are connected on the wiring board, the number of connection points requiring soldering, wire bonding, etc. is inevitably increased, resulting in an undesirably long wiring distance between the electrodes of one of the semiconductor elements and those of another semiconductor element. This requirement has also given rise to an undesirable increase in the wiring resistance. Further, the method of stacking a plurality of chips and accommodating the stacked chips in a single package has not been satisfactory in that the package size becomes larger than the chip size, and the number of chips that can be stacked is also limited. With such a structure too, it is apparent that the increase in the distance required for wiring leads inevitably to degradation of the structural reliability and also lowering of the overall electrical response speed of the circuit.

When the aforementioned method of stacking a plurality of semiconductor elements in a package is employed, the problem regarding the size of the package may be solved. In this method, for example, filmy leads led out from the peripheral part of each of the semiconductor elements are used for establishing electrical connections between the semiconductor elements by pins connected to the individual filmy leads. Because the pins which are not integral with the filmy leads extend in the direction of stacking the semiconductor elements, the electrical connections between the semiconductor elements can be conveniently achieved, and the electrical distance of the connecting wiring can be shortened. However, this structural arrangement requires many connection points connecting the electrodes of one of the semiconductor elements to those of another semiconductor element by the filmy leads, and, from this requirement too, the resultant structure has also the problem in regard to the electrical reliability.

In the case of the aforementioned method in which a wiring board is disposed along one of the side surfaces of semiconductor elements for electrically connecting these semiconductor elements (as disclosed in JP-A-62-293749), the semiconductor elements are inevitably adversely affected by the heat generated during operation of the semiconductor elements thereby causing expansion and contraction of the semiconductor elements. This is because the semiconductor elements are firmly fixed together by the wiring board and have no operational flexibility.

SUMMARY OF THE INVENTION

It is an object of the present invention to provide a semiconductor device comprising a stack of semiconductor elements that can be mounted with high mounting efficiency.

Another object of the present invention is to provide a semiconductor device in which the problem of the stress due to generation of heat can be substantially solved.

Still another object of the present invention is to provide a semiconductor device which has high operational reliability and can be easily assembled.

In summary, the present invention provides a high mounting density semiconductor device in which a plurality of semiconductor elements each having a bump deposited on each of electrodes formed on the surface are stacked, and a plurality of leads disposed closely adjacent to the semiconductor elements to extend in a direction perpendicular with respect to the semiconductor elements are bonded to the bumps respectively thereby integrally assembling the plural semiconductor elements.

Some of preferred embodiments of the high mounting density semiconductor device according to the present invention have features which will now be described.

FIRST EMBODIMENT

This first embodiment of the high mounting density semiconductor device comprises a stack of a plurality of semiconductor elements each having a bump deposited on each of electrodes formed on the marginal edges of the surface, and a plurality of corresponding leads disposed closely adjacent to the stacked semiconductor elements, the leads being bonded to the bumps respectively thereby electrically integrally assembling the plural semiconductor elements.

SECOND EMBODIMENT

This second embodiment of the high mounting density semiconductor device comprises a stack of a plurality of semiconductor elements each having a plurality of electrodes formed near the marginal edges of the surface and a plurality of bumps electrically connected to the electrodes respectively, and a plurality of leads disposed closely adjacent to the stacked semiconductor elements, the leads being bonded to the bumps respectively thereby electrically integrally assembling the plural semiconductor elements.

THIRD EMBODIMENT

This third embodiment of the high mounting density semiconductor device comprises a stack of a plurality of semiconductor elements each having many electrodes formed near the marginal edges of the surface and a plurality of bumps corresponding to the surface electrodes respectively, and a plurality of leads disposed closely adjacent to the stacked semiconductor elements, the leads being electrically and mechanically bonded to the bumps respectively thereby integrally assembling the plural semiconductor elements.

FOURTH EMBODIMENT

This fourth embodiment of the high mounting density semiconductor device comprises a stack of a plurality of semiconductor elements each having a plurality of electrodes formed near the marginal edges of the surface and a plurality of bumps electrically connected to the surface electrodes respectively, a plurality of leads disposed closely adjacent to the stacked semiconductor elements, the leads being bonded to the bumps respectively thereby electrically integrally assembling the plural semiconductor elements, and an encapsulant sealing to shield the integrally assembled semiconductor elements from the outside.

FIFTH EMBODIMENT

This fifth embodiment of the high mounting density semiconductor device comprises a stack of a plurality of semiconductor elements each having many electrodes formed near the marginal edges of the surface and a plurality of bumps corresponding to the surface electrodes respectively, a plurality of leads disposed closely adjacent to the stacked semiconductor elements, the leads being electrically and mechanically bonded to the bumps respectively thereby integrally assembling the plural semiconductor elements, and an encapsulant molding the integrally assembled group of the semiconductor elements.

SIXTH EMBODIMENT

This sixth embodiment of the high mounting density semiconductor device comprises a stack of a plurality of semiconductor elements each having a bump deposited on each of surface electrodes, and a plurality of leads disposed closely adjacent to the stacked semiconductor elements to extend in a direction perpendicular with respect to the semiconductor elements, the leads being bonded to the bumps respectively thereby integrally assembling the plural semiconductor elements.

The lead preferably used in the present invention is, for example, that of the J type or gull wing type.

In the semiconductor device of the present invention, the semiconductor elements are connected by the leads disposed closely adjacent to and extending in a direction perpendicular with respect to them, so that the area required for mounting the completed semiconductor device does not substantially differ from the chip size, and a very high mounting efficiency can be achieved. The present invention which enables the desired high density mounting of the semiconductor elements is thus quite useful for reducing the size and weight of and improving the operating performance of electronic and electrical apparatuses.

DESCRIPTION OF THE PREFERRED EMBODIMENTS

Figure 1:
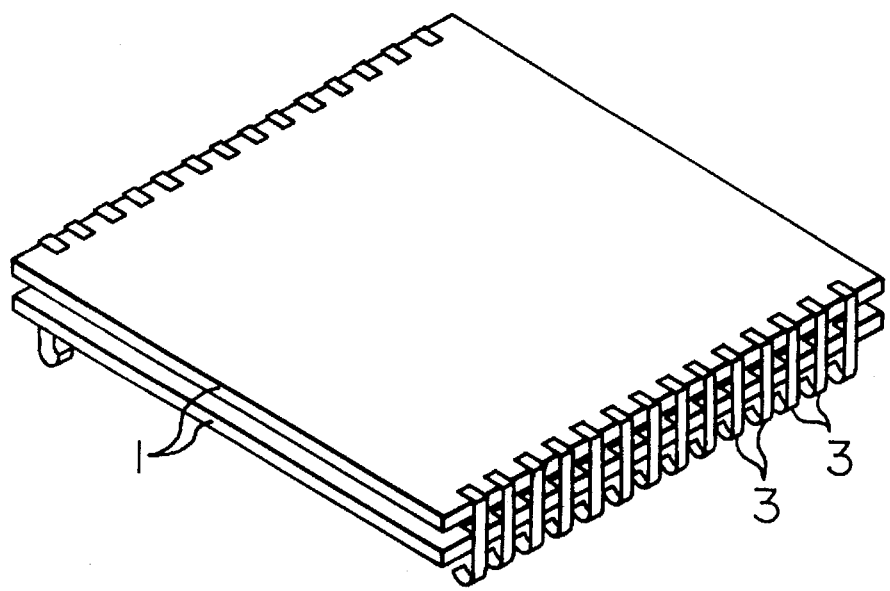
FIG. 1 is a schematic perspective view of an embodiment of the high mounting density semiconductor device of the present invention which includes a stack of two semiconductor elements 1.

Preferred embodiments of the high mounting density semiconductor device according to the present invention will now be described in detail. FIG. 1 shows the structure of an embodiment of the semiconductor device which includes a stack of two semiconductor elements 1. The semiconductor device shown in FIG. 1 can be made by bonding bumps 2 deposited on electrodes formed on the marginal edges of the semiconductor elements 1 to various kinds of leads 3 shown in FIG. 4A to FIG. 4F. (In FIG. 1, the leads 3 shown in FIG. 4B are used.)

The semiconductor elements 1 shown in FIG. 1 are, for example, silicon chips each having a circuit formed on its surface and include, for example, those used for memories, logic circuits and microcomputers. The present invention can be applied to semiconductor elements having a wide range of dimensions. In a prior art semiconductor device, the length of wiring between semiconductor elements tends to become long when a plurality of such semiconductor elements are mounted one by one on a printed wiring board, and this long wiring distance leads frequently to the problem of an undesirable delay of the signal propagation speed and generation of noise. In contrast, the manner of mounting semiconductor elements in the case of the present invention is advantageous in that the required wiring distance between the semiconductor elements can be shortened as compared to the prior art and is thus effective for accelerating the signal propagation speed and reducing the noise.

Although the present invention is applicable to various kinds of semiconductor elements, application of the present invention to a DRAM (a dynamic random access memory) will be described by way of example. The chip sizes of a 16MDRAM (a prototype) and a 64MDRAM (a prototype) are 8.15×15.58×0.4 t mm and 11.43×19.93×0.4 t mm respectively. In the case of a 256MRDAM, its chip size is presumed to become larger. The larger the chip size, the package size will naturally become larger, and the area required for mounting one element will also become correspondingly larger. The present invention is useful for high density mounting of such semiconductor elements tending to become larger and larger in size. Also, such an increase in the chip size leads generally to a lowered yield rate of production. However, when the chip is divided into a plurality of elements, and these elements are assembled according to the method of the present invention, both the desired improvement in the yield rate of production and the desired improvement in the mounting density can be simultaneously attained.

Figure 2:
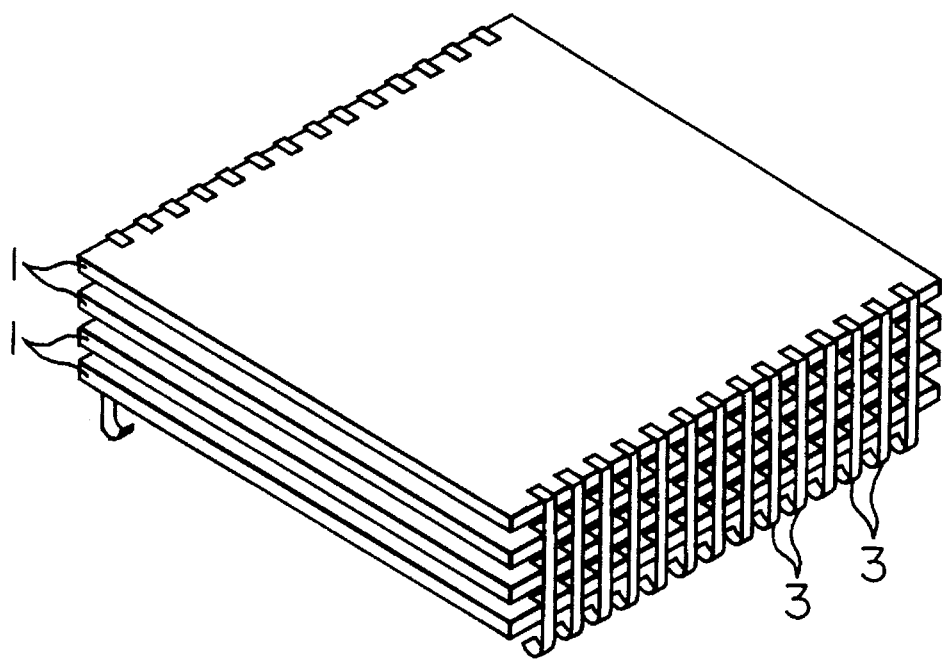
FIG. 2 is a schematic perspective view of another embodiment of the high mounting density semiconductor device of the present invention which includes a stack of four semiconductor elements 1.
Figure 3:
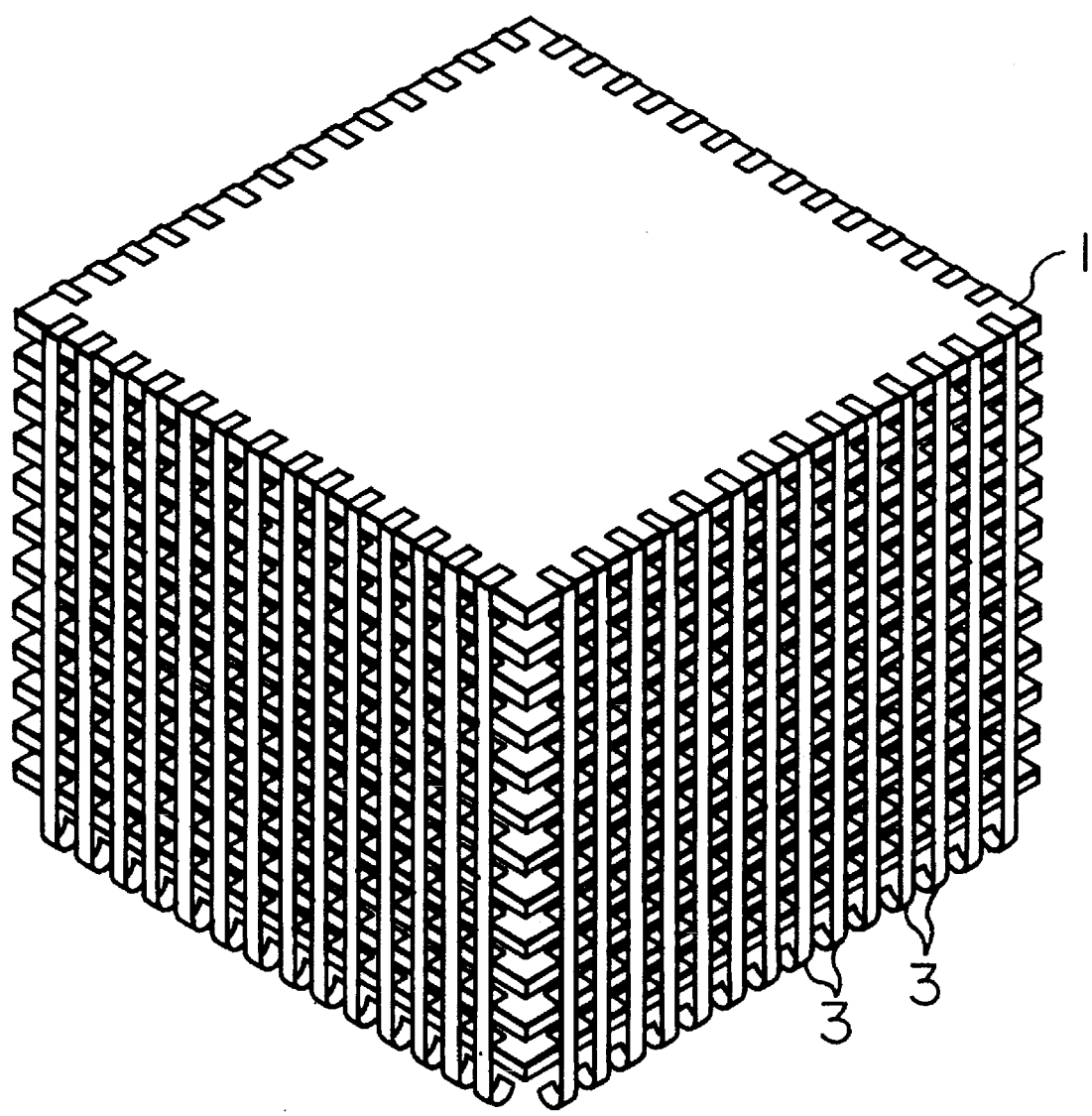
FIG. 3 is a schematic perspective view of still another embodiment of the high mounting density semiconductor device of the present invention which includes a stack of twelve semiconductor elements 1.

Another embodiment of the semiconductor device shown in FIG. 2 includes a stack of four semiconductor elements 1, and still another embodiment of the semiconductor device shown in FIG. 3 includes a stack of twelve semiconductor elements 1. Each of these semiconductor devices can be made in a manner similar to that described by reference to FIG. 1. The bump 2 deposited on each surface electrode of each semiconductor element 1 is preferably formed of gold, and it is also preferable that the bump of gold is deposited to entirely cover the associated electrode on the surface of the semiconductor element 1. For example, such a bump of gold may be deposited on the electrode surface by fusion of a ball of gold formed during wire bonding by the use of a gold wire or by plating a bump of gold or by transfer printing a bump of gold formed on a substrate of glass.

Figure 4A:
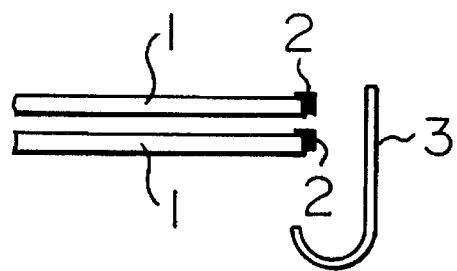
FIGS. 4A to 4F are schematic sectional views showing various combinations of leads 3 and bumps 2 used for connecting the leads 3 to surface electrodes 2' of the semiconductor elements 1 respectively.
Figure 4B:
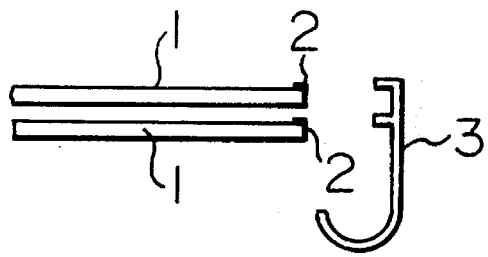
Figure 4C:
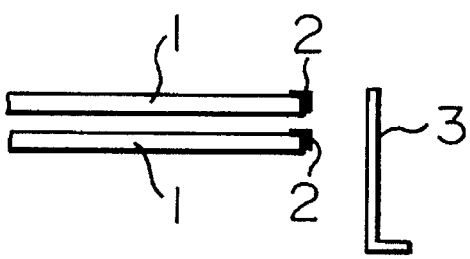
Figure 4D:
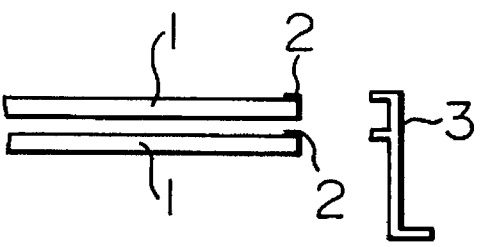
Figure 4E:
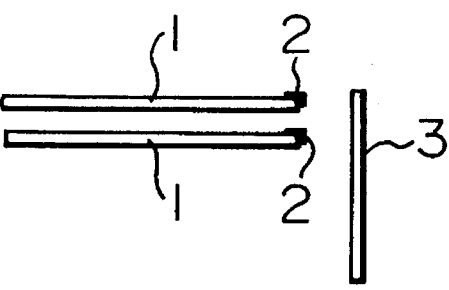
Figure 4F:
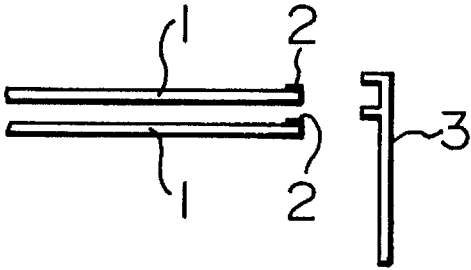

FIG. 4A shows that the bump 2 deposited on the associated electrode partly protrudes in the form of an overhang from the side surface of each semiconductor element 1. In such a case, a lead 3 having a J-like shape as shown in FIG. 4A is preferably bonded to the bumps 2 at the side surfaces of the semiconductor elements 1. FIG. 4B shows that the bump 2 is deposited on the upper surface of each semiconductor element 1. In such a case, a lead 3 having also a J-like shape as shown in FIG. 4B is preferably bonded to the bumps 2 at the upper surfaces of the semiconductor elements 1. In the present invention, the shape of the tip part of such a lead 3 is not especially limited. For example, as shown in FIGS. 4B, 4D and 4F, the tip part of the lead 3 has projections to be bonded to the bumps 2. Besides the leads 3 of the J type shown in FIGS. 4A and 4B, leads 3 of the gull wing type as shown in FIGS. 4C and 4D or leads 3 of the straight type as shown in FIGS. 4E and 4F may also be used when so required.

The term "bump" is used in the present invention to indicate a built-up bead-like form of an electrically conductive material deposited on an electrode of, for example, a semiconductor chip. Although the semiconductor chip is formed with a plurality of electrodes on its surface, it is difficult to simply electrically connect those electrodes to corresponding leads respectively. Therefore, the electrically conductive material is deposited in a built-up bead-like form on the associated electrode so as to facilitate the electrical connection between the electrode and the lead. A metal, for example, aluminum (Al) or gold (Au) is commonly used as the material of both the electrode and the conductor.

An example of the dimensions of the bump 2 and the lead 3 will now be described. The size of each electrode on the surface of the element 1 is, for example, about 60 to 100 μm square, and the size of the bump 2 deposited on the surface of the electrode is equal to or slightly smaller than that of the electrode. The lead 3 is electrically connected to this bump 2, and its size is about 60 to 100 μm wide and 20 to 200 μm thick. The minimum values of the dimensions of the electrode and the lead are referred to as 60 μm and 20 μm by way of example only, and the present invention is equally effectively applicable to the case where these minimum values become further smaller as a result of a further future improvement in the integration density of the semiconductor elements 1.

Figure 5:
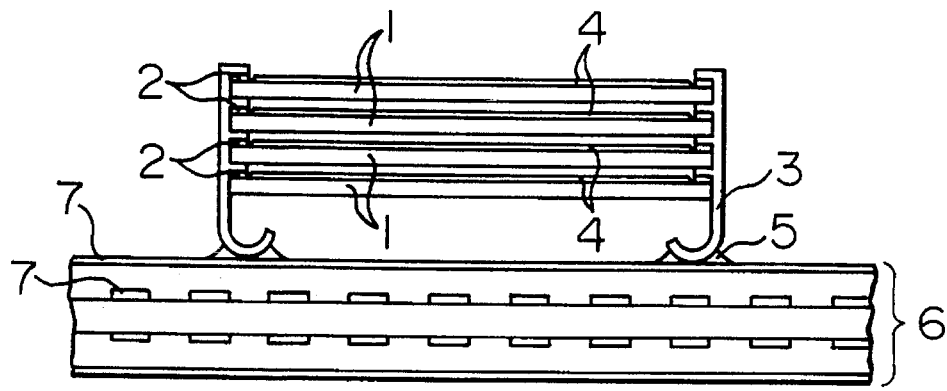
FIG. 5 is a schematic sectional front elevational view of the high mounting density semiconductor device of the present invention formed by mounting a stack of semiconductor elements 1 on a printed wiring board 6.
Figure 6:
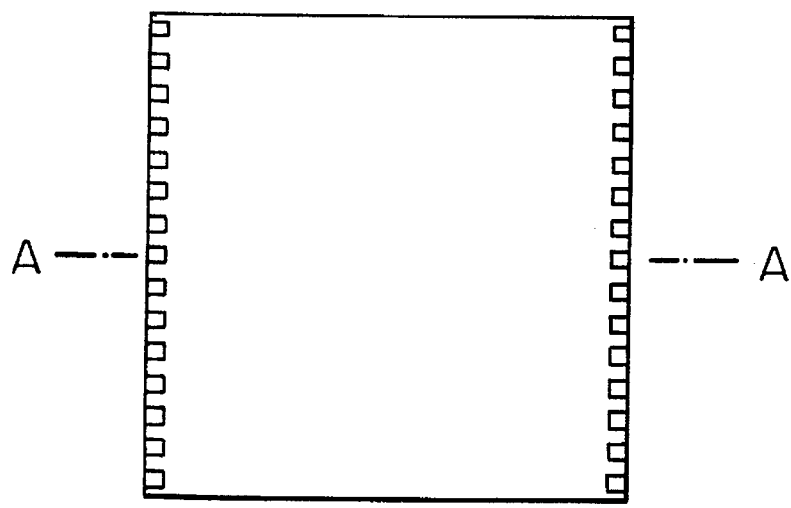
FIG. 6 is a schematic top plan view of the semiconductor elements shown in FIG. 5.
Figure 7:
FIG. 7 is a schematic sectional view taken along the line A–A' in FIG. 6.
Figure 8:
FIG. 8 is a schematic sectional view showing a bump 2 deposited by plating gold on the electrode 2' shown in FIG. 7.
Figure 9:
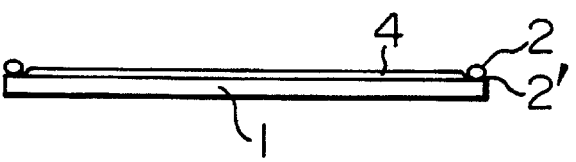
FIG. 9 is a schematic sectional view showing the case where a gold wire used for wire bonding is used to deposit the bump 2 on the electrode 2' by fusion of a ball of gold.

FIG. 5 schematically shows a practical form of the high mounting density semiconductor device of the present invention formed by mounting the stack of the semiconductor elements 1 on a printed wiring board 6 having built-in wiring 7. FIG. 6 is a schematic top plan view of the stack of the semiconductor elements 1 shown in FIG. 5 to show the electrodes 2' formed on their upper surfaces, and FIG. 7 is a schematic sectional view taken along the line A–A' in FIG. 6. In FIG. 7, the reference numeral 4 designates a chip coating layer. FIG. 8 is a schematic sectional view to show that the bump 2 is deposited by plating gold on each electrode 2'. FIG. 9 is also a schematic sectional view to show that the bump 2 is deposited on the electrode 2' by fusion of a ball of gold by the use of a gold wire used for wire bonding.

The lead 3 of the straight type may be first mounted and may then be shaped into the form of the J type or the gull wing type. Although each lead 3 may be bonded to the associated bump 2 of gold by various heating methods, a method of localized heating and fusion by a laser beam is most preferable so that unnecessary heat may not be applied to areas other than the bonding area.

As described above, the chip coating layer 4 in the form of a polyimide layer, an epoxy resin layer, a silicone resin layer or the like is formed on the surface of each of the semiconductor elements 1 used in the present invention, so that sufficient operational reliability can be ensured even when all the semiconductor elements 1 may not be especially sealed by the use of an encapsulant after being assembled. However, when higher reliability is demanded, it is preferable that the assembly is to be entirely encapsulated by the use of a resin composition, such as, an epoxy resin or that the lower and upper surfaces of the chips, the gaps between the chips or the side surfaces of the chips are to be coated or impregnated with a low-elasticity rubber-like resin of the non-solvent type. See FIG. 5, showing encapsulant 10. FIGS. 5 and 7 to 9 schematically illustrate the case where a polyimide coating layer 4 is used as an α-ray shielding layer for the purposes of protection of the surface of each semiconductor element 1 and prevention of occurrence of soft errors.

We claim:

1. A high mounting density semiconductor device comprising a stack of a plurality of semiconductor elements, stacked in a first direction, mounted on a mounting board, each semiconductor element having bumps respectively deposited on electrodes formed on marginal edges of a first surface of each of the plurality of semiconductor elements, the device further including a plurality of corresponding leads disposed closely adjacent to said stack of a plurality of semiconductor elements and extending only in said first direction alongside said stack, with projections extending from the leads for bonding to the bumps, a respective lead being electrically connected to bumps on at least two of the semiconductor elements, said leads being bonded to said bumps respectively so that each of the leads is electrically bonded directly to corresponding bumps of said plurality of semiconductor elements, thereby electrically integrally assembling said plurality of semiconductor elements, wherein said bumps on at least two of the semiconductor elements, to which the respective lead is electrically connected, are on respective faces of the at least two of the semiconductor elements, said respective faces each facing in a same direction, whereby first surfaces of the at least two of the semiconductor elements face in the same direction, and wherein said stack is mounted on said mounting board via said leads.

2. A high mounting density semiconductor device according to claim 1, wherein said leads are of a J type.

3. A high mounting density semiconductor device according to claim 1, wherein said leads are of a gull wing type.

4. A high mounting density semiconductor device according to claim 1, wherein the bumps overhang side surfaces of the semiconductor elements on which they are provided.

5. A high mounting density semiconductor device according to claim 1, wherein said respective lead is electrically connected to bumps on at least three of the semiconductor elements.

6. A high mounting density semiconductor device according to claim 1, wherein the projections are integrally formed with the leads.

7. A high mounting density semiconductor device comprising a stack of a plurality of semiconductor elements, stacked in a first direction, mounted on a mounting board, each semiconductor element having a plurality of electrodes formed near marginal edges of a first surface of each of the plurality of semiconductor elements and a plurality of bumps electrically connected to said electrodes respectively, and a plurality of leads disposed closely adjacent to said stack of a plurality of semiconductor elements and extending only in said first direction alongside said stack, with projections extending from the leads for bonding to the bumps, a respective lead being electrically connected to bumps on at least two of the semiconductor elements, said leads being bonded to said bumps respectively so that each of the leads is electrically bonded directly to corresponding bumps of said plurality of semiconductor elements, thereby electrically integrally assembling said plurality of semiconductor elements, wherein said bumps on at least two of the semiconductor elements, to which the respective lead is electrically connected, are on respective faces of the at least two of the semiconductor elements, said respective faces each facing in a same direction, whereby first surfaces of the at least two of the semiconductor elements face in the same direction, and wherein said stack is mounted on said mounting board via said leads.

8. A high mounting density semiconductor device according to claim 7, wherein said leads are of a J type.

9. A high mounting density semiconductor device according to claim 7, wherein said leads are of a gull wing type.

10. A high mounting density semiconductor device according to claim 7, wherein said respective lead is electrically connected to bumps on at least three of the semiconductor elements.

11. A high mounting density semiconductor device according to claim 7, wherein the projections are integrally formed with the leads.

12. A high mounting density semiconductor device comprising a stack of a plurality of semiconductor elements, stacked in a first direction, mounted on a mounting board, each semiconductor element having many surface electrodes formed near marginal edges of a first surface of each of the semiconductor elements and a plurality of bumps corresponding to said surface electrodes respectively, and a plurality of leads disposed closely adjacent to said stack of a plurality of semiconductor elements and extending only in said first direction alongside said stack, with projections extending from the leads for bonding to the bumps, a respective lead being electrically connected to bumps on at least two of the semiconductor elements, said leads being electrically and mechanically bonded to said bumps respectively so that each of the leads is electrically bonded directly to corresponding bumps of said plurality of semiconductor elements, thereby integrally assembling said plurality of semiconductor elements, wherein said bumps on at least two of the semiconductor elements, to which the respective lead is electrically connected, are on respective faces of the at least two of the semiconductor elements, said respective faces each facing in a same direction, whereby first surfaces of the at least two of the semiconductor elements face in the same direction, and wherein said stack is mounted on said mounting board via said leads.

13. A high mounting density semiconductor device according to claim 12, wherein said leads are of a J type.

14. A high mounting density semiconductor device according to claim 12, wherein said leads are of a gull wing type.

15. A high mounting density semiconductor device according to claim 12, wherein said respective lead is electrically connected to bumps on at least three of the semiconductor elements.

16. A high mounting density semiconductor device according to claim 12, wherein the projections are integrally formed with the leads.

17. A high mounting density semiconductor device comprising a stack of a plurality of semiconductor elements, stacked in a first direction, mounted on a mounting board, each semiconductor element having a plurality of electrodes formed near marginal edges of a first surface of the plurality of semiconductor elements and a plurality of bumps electrically connected to said surface electrodes respectively, a plurality of leads disposed closely adjacent to said stack of a plurality of semiconductor elements and extending only in said first direction alongside said stack, with projections extending from the leads for bonding to the bumps, a respective lead being electrically connected to bumps on at least two of the semiconductor elements, said leads being bonded to said bumps respectively so that each of the leads is electrically bonded directly to corresponding bumps of said plurality of semiconductor elements, thereby electrically integrally assembling said plurality of semiconductor elements, so as to provide integrally assembled semiconductor elements, and an encapsulant sealing to shield said integrally assembled semiconductor elements from the outside, wherein said bumps on at least two of the semiconductor elements, to which the respective lead is electrically connected, are on respective faces of the at least two of the semiconductor elements, said respective faces each facing in a same direction, whereby first surfaces of the at least two of the semiconductor elements face in the same direction, and wherein said stack is mounted on said mounting board via said leads.

18. A high mounting density semiconductor device according to claim 17, wherein said leads are of a J type.

19. A high mounting density semiconductor device according to claim 17, wherein said leads are of a gull wing type.

20. A high mounting density semiconductor device according to claim 17, wherein said respective lead is electrically connected to bumps on at least three of the semiconductor elements.

21. A high mounting density semiconductor device according to claim 17, wherein the projections are integrally formed with the leads.

22. A high mounting density semiconductor device comprising a stack of a plurality of semiconductor elements, stacked in a first direction, mounted on a mounting board, each semiconductor element having many surface electrodes formed near marginal edges of a first surface of the plurality of semiconductor elements and a plurality of bumps corresponding to said surface electrodes respectively, a plurality of leads disposed closely adjacent to said stack of a plurality of semiconductor elements and extending only in said first direction alongside said stack, with projections extending from the leads for bonding to the bumps, a respective lead being electrically connected to bumps on at least two of the semiconductor elements, said leads being electrically and mechanically bonded to said bumps respectively so that each of the leads is electrically bonded directly to corresponding bumps of said plurality of semiconductor elements, thereby integrally assembling said plurality of semiconductor elements, so as to provide an integrally assembled group of said semiconductor elements, and an encapsulant molding said integrally assembled group of said semiconductor elements, wherein said bumps on at least two of the semiconductor elements, to which the respective lead is electrically connected, are on respective faces of the at least two of the semiconductor elements, said respective faces each facing in a same direction, whereby first surfaces of the at least two of the semiconductor elements face in the same direction, and wherein said stack is mounted on said mounting board via said leads.

23. A high mounting density semiconductor device according to claim 22, wherein said leads are of a J type.

24. A high mounting density semiconductor device according to claim 22, wherein said leads are of a gull wing type.

25. A high mounting density semiconductor device according to claim 22, wherein said respective lead is electrically connected to bumps on at least three of the semiconductor elements.

26. A high mounting density semiconductor device according to claim 22, wherein the projections are integrally formed with the leads.

27. A high mounting density semiconductor device comprising a stack of a plurality of semiconductor elements, stacked in a first direction, mounted on a mounting board, each semiconductor element having bumps deposited on surface electrodes on a first surface of each of the semiconductor elements, and a plurality of leads disposed closely adjacent to said stack of a plurality of semiconductor elements and extending only in said first direction alongside said stack, with projections extending from the leads for bonding to the bumps, a respective lead being electrically connected to bumps on at least two of the semiconductor elements, said leads being bonded to said bumps respectively so that each of the leads is electrically bonded directly to corresponding bumps of said plurality of semiconductor elements, thereby integrally assembling said plurality of semiconductor elements, wherein said bumps on at least two of the semiconductor elements, to which the respective lead is electrically connected, are on respective faces of the at least two of the semiconductor elements, said respective faces each facing in a same direction, whereby first surfaces of the at least two of the semiconductor elements face in the same direction, and wherein said stack is mounted on said mounting board via said leads.

28. A high mounting density semiconductor device according to claim 27, wherein said leads are of a J type.

29. A high mounting density semiconductor device according to claim 27, wherein said respective lead is electrically connected to bumps on at least three of the semiconductor elements.

30. A high mounting density semiconductor device according to claim 27, wherein the projections are integrally formed with the leads.

* * * * *